United States Patent
Chen et al.

[11] Patent Number: 5,953,633
[45] Date of Patent: Sep. 14, 1999

[54] METHOD FOR MANUFACTURING SELF-ALIGNED TITANIUM SALICIDE USING TWO TWO-STEP RAPID THERMAL ANNEALING STEPS

[75] Inventors: Chun-Cho Chen, Hsinhcu; Jui-Lung Hsu, Taoyuan, both of Taiwan

[73] Assignee: Utek Semiconductor Corp., Taiwan

[21] Appl. No.: 08/906,554

[22] Filed: Aug. 5, 1997

[30] Foreign Application Priority Data

Jul. 11, 1997 [TW] Taiwan .................................. 86109783

[51] Int. Cl.$^6$ ...................................................... H01L 21/44
[52] U.S. Cl. ........................ 438/683; 438/682; 438/664; 438/655
[58] Field of Search ................................. 438/683, 682, 438/664, 655

[56] References Cited

U.S. PATENT DOCUMENTS

| | | | |
|---|---|---|---|
| 4,545,116 | 10/1985 | Lau | 29/591 |
| 5,043,300 | 8/1991 | Nulman | 437/200 |
| 5,683,941 | 11/1997 | Kao et al. | 437/200 |
| 5,716,485 | 2/1998 | Salimian et al. | 156/345 |
| 5,759,899 | 6/1998 | Saito | 438/303 |
| 5,893,751 | 4/1999 | Jenq et al. | 438/655 |

OTHER PUBLICATIONS

Delfino, M., B.–C. Chung, W. Tsai, and S. Salimian. "X–ray photoemission analysis and electrical contact properties of NF3 plasma cleaned Si surfaces," Journal of Applied Physics, vol. 72 pp. 3718–3725, Oct. 1992.

*Primary Examiner*—Charles Bowers
*Assistant Examiner*—Sam Lee

[57] ABSTRACT

A method of manufacturing self-aligned titanium salicide is provided which includes the steps of forming a LOCOS isolation region on a silicon substrate, forming a titanium layer on the surface of the silicon substrate, performing a first two-step rapid thermal anneal on the silicon substrate in an ambient filled with hydrogen and nitrogen gases to convert the titanium layer into a titanium salicide layer, selectively etching the silicon substrate to remove the titanium layer that has not reacted with the silicon substrate, and performing a second two-step rapid thermal anneal on the silicon substrate in an ambient filled with hydrogen and nitrogen gases. Each of the two-step rapid thermal anneals include a first pre-heat step and a second anneal step.

6 Claims, 3 Drawing Sheets

METHOD FOR MANUFACTURING SELF-ALIGNED TITANIUM SALICIDE USING TWO TWO-STEP RAPID THERMAL ANNEALING STEPS

BACKGROUND OF THE INVENTION

(1) Field of the Invention

The present invention relates generally to the field of fabrication of integrated circuits, and more particularly, to a process for manufacturing self-aligned Ti-salicide.

(2) Description of the Prior Art

With the continued scaling of complementary metal oxide semiconductor (CMOS) device structures to the deep-submicron ultra large semiconductor integrated circuit (ULSI), the self-aligned titanium salicide which is formed by using a two-step thermal annealing process exhibits excellent properties of reducing surface contact resistivity of the source/drain regions and polysilicon gate is ideally for future deep submicron device technology applications. It has been disclosed in prior publications that, "Refractory silicide for integrated circuits", field in J. Vac. Sci. Tech., Vol. 17, pp.775, 1980 by Muraka, "Titanium disilicide self-aligned source-drain gate technology", field in IDEM Tech. Dig., P.714, 1982 by Lau et. al., and "Titanium silicidation by halogen lamp annealing", field in J. Appl. Phys., Vol.57, P.5252, 1985 by Okamoto, all show similar discussions.

Owing to the advance of higher packing density semiconductor devices and the complexity of implementing self-aligned titanium salicide, further improvement of self-aligned titanium salicide process is necessary and becomes more important. With reference to FIG. 1, a flow chart illustrating the process of forming a self-aligned titanium salicide is illustrated according to the prior art, which includes the deposition of titanium (see 120) followed by a first rapid thermal annealing (RTA1) (see 130), a selective etch (see 140), and a second rapid thermal annealing (RTA2) (see 150). The above-mentioned process has drawbacks of:

(1) After forming the transistor (see 100), silicon substrate is cleaned via dipping in the HF solution see (110). However, silicon substrate is unavoidably reacted with oxygen to form a native oxide when exposed to atmosphere. This leads to an increment of surface resistivity of salicide and, in turns, affects the quality of self-aligned titanium salicide manufactured later. Also, the use of HF solution will deteriorate environment.

(2) The rapid thermal annealing treatment shown in the process steps 130 and 150 are performed in the pure nitrogen ambient. However, residual oxygen in the pure nitrogen ambient will also react with substrate to form a TiOxNy. Therefore, it is different to achieve a good-quality salicide formation.

(3) The rapid thermal annealing treatment shown in the process steps 130 and 150 are operated by increasing the temperature in the ambient up to a predetermined temperature range in a short time. This leads to the problems of forming rugged Ti-salicide surface and resulting in titanium diffusion therein and, as a result, increases the possibility of current leakage from both source and drain regions.

In order to improve the drawbacks involved in the traditional self-aligned titanium salicide process, the present invention provides an improved process of forming a self-aligned Titanium Salicide to resolve the above-mentioned problems.

SUMMARY OF THE INVENTION

It is the principal object of this invention to provide a reliable process of manufacturing self-aligned titanium salicides which can improve the quality of self-aligned titanium salicides more efficiently.

Another object of the present invention is to provide a process of fabricating self-aligned titanium salicides, wherein the silicon substrate surface is exposed to a plasma formed from argon (Ar) gas in a vacuum chamber, and then is cleaned by plasma etching. The possibility of forming native oxide layer on the substrate surface is eliminated and, in turns, increased the quality of titanium deposition. In addition, the cleaning step using HF solution as used in the prior art is removed. Therefore, the production cost can be reduced apparently.

It is a further object of the invention to provide a process of manufacturing self-aligned titanium salicides, wherein a two-step rapid thermal annealing process is performed. The first stage pre-heat step is operated at lower temperature to prevent titanium salicide from forming rugged salicide due to excessive thermal expansion. Moreover, in doing so, the problem of excessive diffusion of the titanium atoms can be resolved.

The final object of the invention is to provide a process of fabricating self-aligned titanium salicide, wherein rapid thermal annealing process is performed in the ambient with mixture of hydrogen and nitrogen gases. The hydrogen gas reacts with residual oxygen residing in nitrogen gas to form a high-quality titanium salicide (lower resistivity). In other words, the quantity of TiOxNy is reduced via said process.

The process steps used to fill the above-mentioned objects are described as follows.

Local Oxidation of Silicon (LOCOS) isolation is formed on the silicon substrate. MOSFET is then formed in the active region of the silicon substrate which includes gate oxide, polysilicon gate, sidewall spacers, and drain/source regions. The following procedure acts as one of the key points for the present invention comprising the process steps of: (1) loading the silicon substrate into the chamber where titanium deposition will be preferred later, (2) cleaning the surface of the silicon substrate by an etching procedure via applying plasma formed from argon (Ar) gas, and followed by (3) depositing a titanium film on the surface of the silicon substrate.

Next, a first two-step rapid thermal annealing (RTA) process is performed to form the so-called C49 titanium salicide (TiSi$_x$). A selective wet etching process is then applied to remove the portion of titanium film not reacted with the silicon substrate. Thereafter, a second two-step RTA process is performed at different operating temperatures, to transform C49 type titanium salicide (TiSi$_x$) into C54 titanium salicide (TiSi$_2$). The inventive process of manufacturing self-aligned titanium salicides is then completed.

BRIEF DESCRIPTION OF THE APPENDED DRAWINGS

FIG. 1 shows the flow chart illustrating the process of manufacturing self-aligned titanium salicides according to the prior art.

FIGS. 2(A) to 2(C) illustrate the cross-sectional view of a preferred embodiment according to the present invention.

FIG. 3 shows the flow chart illustrating the process of manufacturing self-aligned titanium salicide according to the present invention.

DETAILED DESCRIPTION OF THE INVENTION

Figure 1:
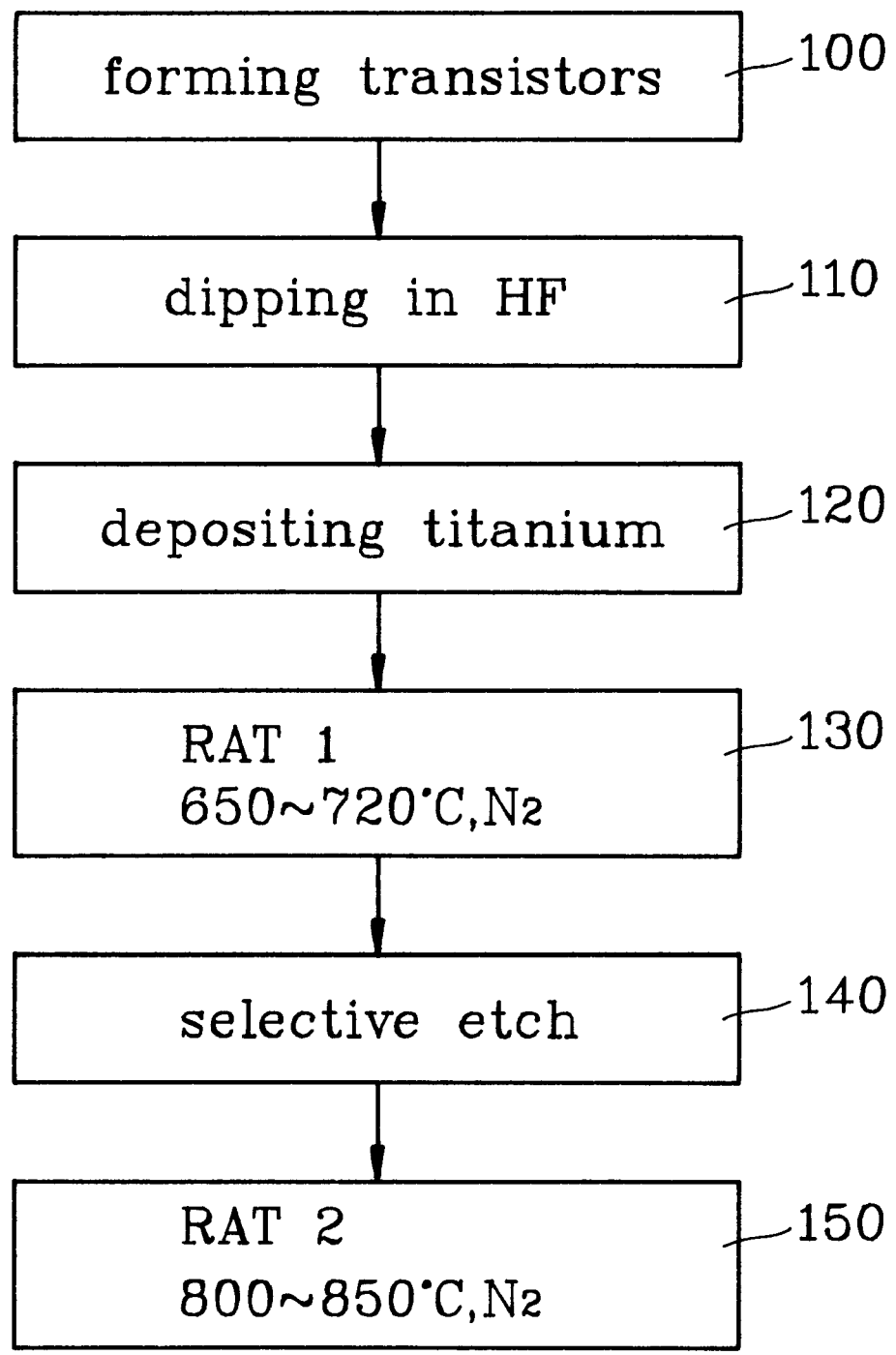

Referring to FIG. 2, LOCOS isolation 23 is formed on the silicon substrate. MOSFET is then formed in the active region of the silicon substrate. The MOSFET comprises gate oxide 25, polysilicon gate 27, sidewall spacers 29, and source/drain regions 31. Unlike traditional method using HF solution to clean silicon substrate, the following steps serve as the key points of the invention comprising the steps of (1) loading the silicon substrate into the chamber where titanium film deposition will be performed later, (2) cleaning the silicon substrate surface by etching procedure via applying plasma formed from argon (Ar) gas. Hence, the possibility of forming the native oxide layer on the silicon substrate surface is eliminated and, in turns, increases the quality of titanium deposition.

The above-mentioned cleaning procedure via applying plasma formed from Ar gas is described as follows. An RF power of 40 to 60 Watts and 450–550 Watts are supplied on the upper electrode and lower electrode for 100–150 seconds, respectively. Preferably, the RF power of 50 Watts and 500 Watts are supplied on the upper electrode and lower electrode, respectively.

Figure 2A:
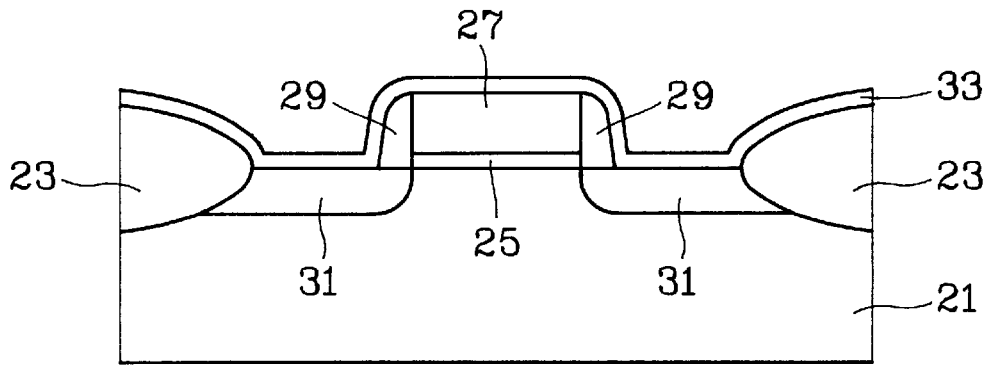

A titanium film 33 of thickness ranging from 500–1000 Angstroms is deposited on the surface of the silicon substrate 21, as shown in FIG. 2(A).

Figure 2B:
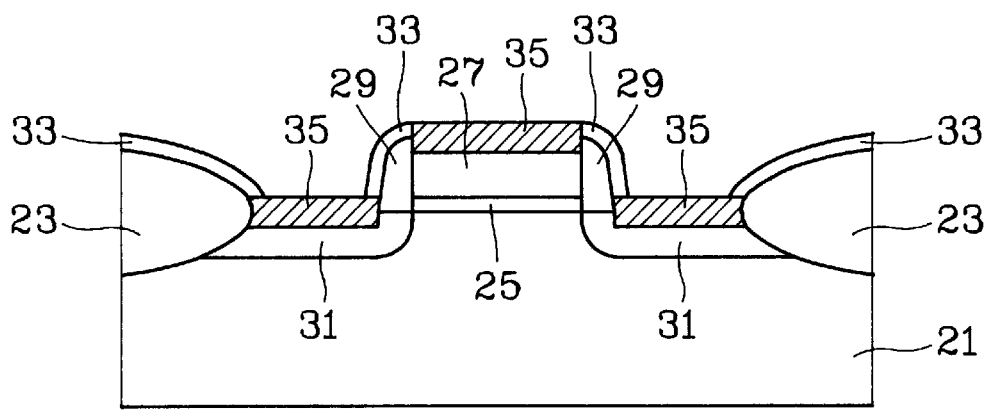

Referring to FIG. 2(B), a first rapid thermal annealing (RTA 1) process will be described. The RTA1 is performed to form so-called C49 titanium salicide (TiSi$_x$) 35. This process serves as one of the key points of the invention comprising a two-step procedure operated at different temperatures. The ambient that RTA1 is performed is filled with hydrogen and nitrogen gases, in which hydrogen gas is in the ratio of 2 to 15%. The first step of RTA1 is performed at temperature ranging from 600 to 650° C. for about 5 to 20 seconds and, followed by proceeding the second step of RTA1 at temperature ranging from 650 to 720° C. for to 10 to 30 seconds. Thus, hydrogen gas is able to react with the residual oxygen residing in nitrogen gas to form titanium salicides with better quality (with lower resistivity) and the TiOxNy produced in the prior art can be eliminated. In addition, since the first step of RTA1 is proceed at lower temperature, rugged titanium salicide surface resulting from excessive thermal expansion is avoided. Also, leakage current resulting from excessive expansion of titanium atoms is reduced.

Figure 2C:
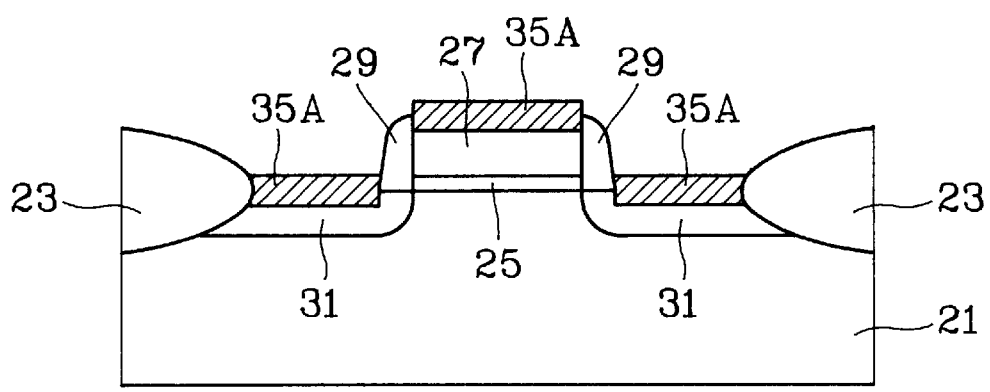

Turning now to FIG. 2(C), a second rapid thermal annealing process (RTA2) will be described. The portion of the titanium film 33 not reacted with silicon substrate is removed by using selective wet etching process. Then, the RTA 2 is performed to transform C49 type titanium salicide (TiSi$_x$) into C54 titanium salicide (TiSi$_2$) 35A. This process also comprises a two-step procedure operated at different temperatures. The ambient performing RTA2 is filled with hydrogen and nitrogen gasses, in which hydrogen gas is also in the ratio of 2 to 15%. The first step of RTA 2 is performed at temperature ranging from 750 to 800° C. for about 5 to 20 seconds and, followed by proceeding the second step of RTA 2 at temperature ranging from 800 to 850° C. for 10 to 30 seconds. The inventive process of manufacturing self-aligned titanium salicides is thus completed.

Figure 3:
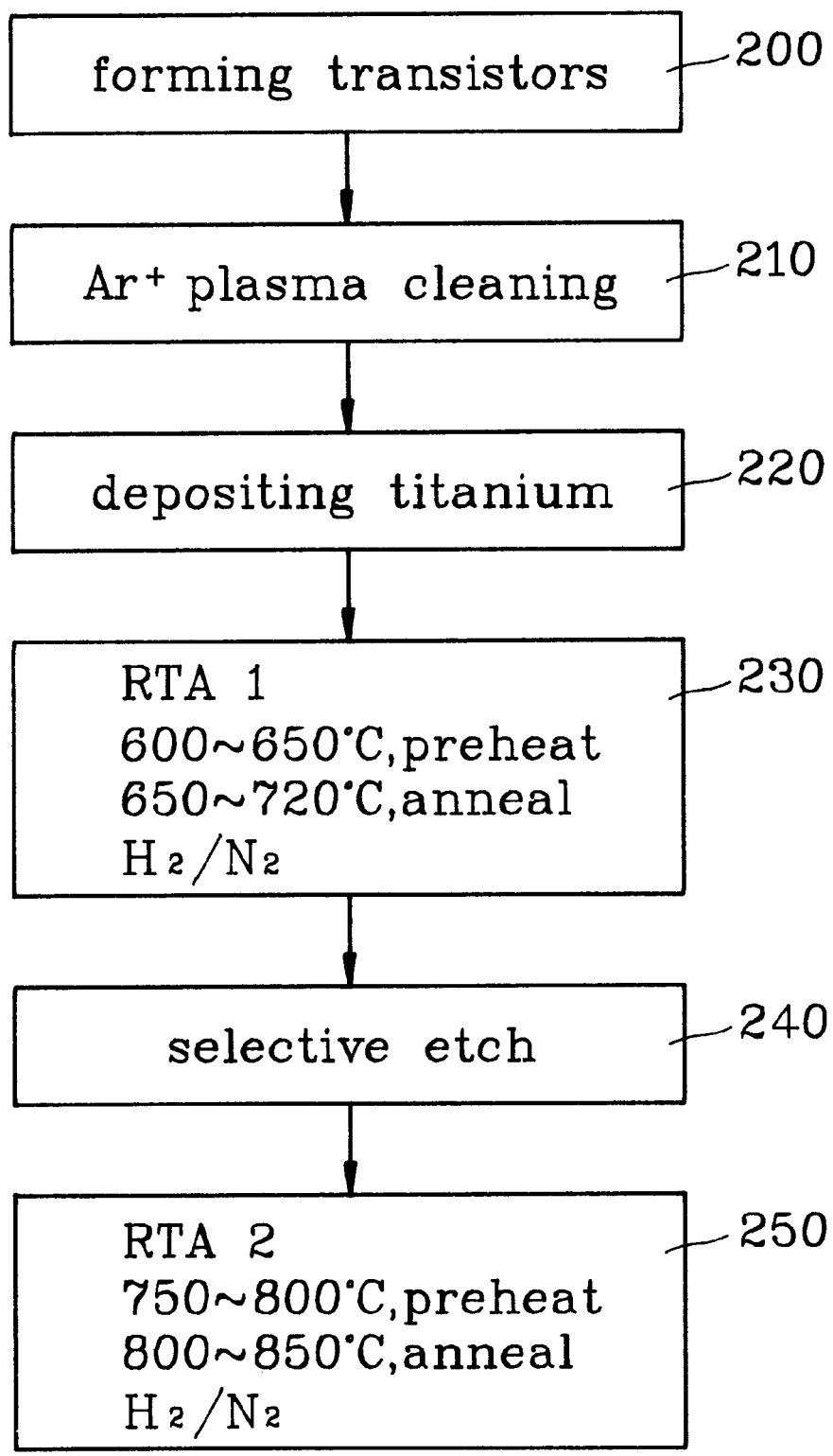

The flow chart illustrating the inventive process of manufacturing self-aligned titanium salicides is shown in FIG. 3. Transistors are formed in step 200, and argon plasma cleaning is then performed in step 210, as explained in greater detail below. Thereafter, titanium is deposited in step 220, followed by a first two-step rapid thermal anneal in step 230 (described in greater detail below), a selective etch in step 240, and a second two-step rapid thermal anneal in step 250 (described in greater detail below). Compared to the process of manufacturing self-aligned titanium salicides according to the prior art, the inventive process has benefits described as follows.

(1) The inventive process has a process step 210 directed to the cleaning of the silicon substrate. The silicon substrate is exposed to a plasma formed from Ar gas in a vacuum chamber, and then is cleaned by plasma etching. The possibility of forming native oxide layer on the substrate surface is eliminated and, as a result, increases the quality of titanium deposition. Moreover, the cleaning step using HF solution as used in the prior art is extracted. Therefore, the production cost can be reduced apparently.

(2) The inventive process has process steps of 230 and 250 dedicated to perform a two-step rapid thermal annealing procedure. These annealing procedures are performed in the ambient with mixture of hydrogen and nitrogen gasses. Unlike traditional TiOxNy produced according to the prior art, the hydrogen gas reacts with residual oxygen residing in the nitrogen gas to form a high-quality titanium salicide with low resistivity.

(3) The inventive process has process steps of 230 and 250 dedicated to perform a two-step rapid thermal annealing procedure. The first stage preheat step is operated at lower temperature to prevent titanium salicide from forming rugged salicide surface due to excessive thermal expansion. Moreover, in doing so, the problem of excessive diffusion of the titanium atoms can be resolved.

While the invention has been particularly shown and described with reference to the preferred embodiments thereof, it will be understood by those skilled in the art that various changes in form and details may be made without departing from the spirits and scope of the invention.

We claim:

1. A method of manufacturing self-aligned titanium salicide, comprising the steps of:

(a) forming a LOCOS isolation region on a silicon substrate having a surface;

(b) forming a titanium layer on the surface of the silicon substrate;

(c) performing a first two-step rapid thermal anneal on the silicon substrate in an ambient filled with hydrogen and nitrogen gases to convert the titanium layer into a titanium salicide layer, wherein the first two-step rapid thermal anneal includes a first rapid-thermal-annealing step performed at a first temperature for about 5 to 20 seconds, and a second rapid-thermal-annealing step performed at a second temperature for about 10 to 30 seconds, with the second temperature being greater than the first temperature;

(d) selectively etching the silicon substrate to remove the titanium layer that has not reacted with the silicon substrate; and (e) performing a second two-step rapid thermal anneal on the silicon substrate in an ambient filled with hydrogen and nitrogen gases, wherein the second two-step rapid thermal anneal includes a third rapid-thermal-annealing step performed at a third temperature for about 5 to 20 seconds, with the third temperature being greater than the second temperature, and a fourth rapid-thermal-annealing step performed at a fourth temperature for about 10 to 30 seconds, with the fourth temperature being greater than the third temperature.

2. The method of claim 1, wherein step (a) further includes cleaning the surface of the silicon substrate by using a plasma formed from Ar gas.

3. The method of claim 2, wherein the plasma formed from Ar gas is triggered by RF power of 40 to 60 Watts and 450 to 500 Watts applied on upper and lower electrodes, respectively.

4. The method of claim 1, wherein the first two-step rapid thermal anneal is performed in an ambient filled with hydrogen and nitrogen gases in which hydrogen gas is in the ratio of 2 to 15 percent.

5. The method of claim 1, wherein the first temperature ranges from 600 to 649 degrees Celcius, and the second temperature ranges from 650 to 720 degrees Celcius.

6. The method of claim 5, wherein the third temperature ranges from 750 to 799 degrees Celcius, and the fourth temperature ranges from 800 to 850 degrees Celcius.

* * * * *